(12) United States Patent
Lee et al.

(10) Patent No.: US 12,308,219 B2
(45) Date of Patent: May 20, 2025

(54) SUBSTRATE TREATING METHOD AND SUBSTRATE TREATING APPARATUS

(71) Applicant: SEMES CO., LTD., Cheonan-si (KR)

(72) Inventors: Seong Gil Lee, Hwaseong-si (KR); Myoung Sub Noh, Hwaseong-si (KR); Dong-Hun Kim, Seoul (KR); Young Je Um, Busan (KR); Dong Sub Oh, Busan (KR); Jun Taek Koo, Seoul (KR); Wan Jae Park, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 264 days.

(21) Appl. No.: 17/716,853

(22) Filed: Apr. 8, 2022

(65) Prior Publication Data
US 2023/0148026 A1     May 11, 2023

(30) Foreign Application Priority Data
Nov. 5, 2021   (KR) .................. 10-2021-0150989

(51) Int. Cl.
*H01J 37/32*      (2006.01)
(52) U.S. Cl.
CPC .. *H01J 37/32724* (2013.01); *H01J 37/32422* (2013.01); *H01J 37/32449* (2013.01); *H01J 37/32834* (2013.01); *H01J 2237/2007* (2013.01); *H01J 2237/334* (2013.01)
(58) Field of Classification Search
CPC ............. H01J 37/32715; H01J 37/3244; H01J 37/32724; H01J 37/32522; H01J 37/32834; H01J 37/32422; H01J 37/32091; H01J 37/32449; H01J 2237/2007; H01J 2237/334

See application file for complete search history.

(56) References Cited

U.S. PATENT DOCUMENTS

| | | | |
|---|---|---|---|
| 2004/0086434 | A1 | 5/2004 | Gadgil et al. |
| 2007/0209686 | A1* | 9/2007 | Bae ............... C23C 16/4405 134/94.1 |
| 2012/0238102 | A1* | 9/2012 | Zhang ............ H01L 21/32135 257/E21.218 |
| 2017/0040170 | A1 | 2/2017 | Guha et al. |
| 2021/0098232 | A1* | 4/2021 | An ..................... H01L 21/6833 |

FOREIGN PATENT DOCUMENTS

| | | |
|---|---|---|
| JP | 2002170813 A | 6/2002 |
| JP | 2003197537 A | 7/2003 |
| JP | 2006114614 A | 4/2006 |
| JP | 2007317908 A | 12/2007 |

(Continued)

*Primary Examiner* — Yuechuan Yu
(74) *Attorney, Agent, or Firm* — Procopio, Cory, Hargreaves & Savitch LLP

(57) ABSTRACT

A substrate treating method includes a temperature stabilizing step for stabilizing a temperature of the substrate to a process temperature in a treating space for treating a substrate, a pressure stabilizing step for stabilizing a pressure of a plasma space for generating a plasma and a pressure of the treating space to a process, the plasma space fluid communicating with the treating space, and a treating step for generating the plasma at the plasma space and treating the substrate using the plasma.

6 Claims, 10 Drawing Sheets

(56) References Cited

FOREIGN PATENT DOCUMENTS

| | | | |
|---|---|---|---|
| JP | 2010512031 | A | 4/2010 |
| JP | 2010206068 | A | 9/2010 |
| JP | 4897010 | B2 | 3/2012 |
| JP | 2013541177 | A | 11/2013 |
| JP | 2014508423 | A | 4/2014 |
| JP | 2014196561 | A | 10/2014 |
| JP | 2018510470 | A | 4/2018 |
| JP | 201912759 | A | 1/2019 |
| KR | 101901158 | B1 | 9/2018 |
| KR | 101967522 | B1 | 4/2019 |
| KR | 102099886 | B1 | 4/2020 |
| WO | 2009144810 | A1 | 12/2009 |
| WO | 2019003663 | A1 | 1/2019 |
| WO | 2020066172 | A1 | 4/2020 |

\* cited by examiner

SUBSTRATE TREATING METHOD AND SUBSTRATE TREATING APPARATUS

CROSS-REFERENCE TO RELATED APPLICATIONS

A claim for priority under 35 U.S.C. § 119 is made to Korean Patent Application No. 10-2021-0150989 filed on Nov. 5, 2021, in the Korean Intellectual Property Office, the entire contents of which are hereby incorporated by reference.

BACKGROUND

Embodiments of the inventive concept described herein relate to a substrate treating method and a substrate treating apparatus.

In a fabrication of a semiconductor device, a desired pattern is formed on a substrate such as a wafer through various processes such as a photography, an etching, an ashing, an ion implantation, and a thin film deposition. Such processes for fabricating the semiconductor device may include an etching process for removing a film formed on the substrate. In the etching process, a plasma and/or an etchant is/are supplied to the film (e.g., a film including an Si, an $SiO_2$, an $Si_3N_4$, or a Poly Si) formed on the substrate such as a wafer to etch the film.

As the semiconductor device is becoming highly integrated, a high level of process precision is required. In order to precisely perform the above-described etching process, it is important to generate the plasma or the etchant according to a preset process recipe. In addition, in order to ensure a uniformity in substrate treating, it is necessary to stabilize a temperature of the substrate to a process temperature.

SUMMARY

Embodiments of the inventive concept provide a substrate treating method and a substrate treating apparatus for efficiently treating a substrate.

Embodiments of the inventive concept provide a substrate treating method and a substrate treating apparatus for effectively removing a film formed on a substrate.

Embodiments of the inventive concept provide a substrate treating method and a substrate treating apparatus for etching a film formed on a substrate without a particle contamination according to process by-products.

The technical objectives of the inventive concept are not limited to the above-mentioned ones, and the other unmentioned technical objects will become apparent to those skilled in the art from the following description.

The inventive concept provides a substrate treating method. The substrate treating method includes a temperature stabilizing step for stabilizing a temperature of the substrate to a process temperature in a treating space for treating a substrate; a pressure stabilizing step for stabilizing a pressure of a plasma space for generating a plasma and a pressure of the treating space to a process, the plasma space fluid communicating with the treating space; and a treating step for generating the plasma at the plasma space and treating the substrate using the plasma.

In an embodiment, the temperature stabilizing step comprises heating the substrate at the treating space by a chuck supporting the substrate, and increasing the pressure of the treating space to the process pressure by supplying a gas to the treating space.

In an embodiment, an ion of the plasma generated at the plasma space is collected by an ion blocker positioned between the plasma space and the treating space during a process of the plasm being introduced from the plasma space to the treating space.

In an embodiment, the pressure stabilizing step comprises: supplying an inert gas to the plasma space; and supplying a first gas which is different from the inert gas to a mixing space provided between the plasma space and the treating space.

In an embodiment, the substrate treating method further comprises an igniting step performed between the pressure stabilizing step and the treating step, for forming a plasma atmosphere at the plasma space.

In an embodiment, the igniting step comprises supplying an inert gas to the plasma space, and the treating step comprises: supplying a second gas which is different from the inert gas to the plasma space; and supplying a first gas which is different from the inert gas to a mixing space provided between the plasma space and the treating space.

In an embodiment, the first gas is a gas including a hydrogen, and the second gas is a gas including a fluorine.

In an embodiment, the substrate treating method further comprises a first exhaust step for exhausting the treating space, after the treating step.

In an embodiment, the substrate treating method further comprises a purge step for supplying a purge gas to the treating space after the first exhaust step; and a second exhaust step for exhausting the treating space after the purge step.

In an embodiment, a pressure of the treating space at the purge step is larger than a pressure of the treating space at the treating step.

The inventive concept provides a substrate treating method using a plasma. The substrate treating method using a plasma includes an introduction step for introducing to a substrate to a treating space of a substrate treating apparatus, the substrate treating apparatus comprising a treating space and a plasma space for generating the plasma, the treating space and the plasma space in fluid communication with one another; a temperature stabilizing step for stabilizing a temperature of the substrate introduced to the treating space to a preset process temperature; a pressure stabilizing step for stabilizing a pressure of the plasma space and a pressure of the treating space to a process pressure; and a treating step for treating the substrate using the plasma.

In an embodiment, the temperature stabilizing step comprises heating the substrate at the treating space by a chuck supporting the substrate, and increasing the pressure of the treating space to the process pressure by supplying an inert gas to the treating space.

In an embodiment, an ion generated at the plasma space is collected by an ion blocker positioned between a mixing space and the plasma space during the ion is flowing from the plasma space to the mixing space, the mixing space provided at the substrate treating apparatus and placed between the treating space and the plasma space.

In an embodiment, the substrate treating method further comprises between the pressure stabilizing step and the treating step, an igniting step for forming a plasma atmosphere at the plasma space, and wherein the pressure stabilizing step and the igniting step comprises: supplying a first gas to the mixing space; and supplying an inert gas to the plasma space.

In an embodiment, the treating step comprises: supplying a first gas to the mixing space; and supplying a second gas which is different from the first gas to the plasma space.

In an embodiment, the first gas is a gas including an $NH_3$, and the second gas is a gas including an $NH_3$.

In an embodiment, the substrate treating method further comprises a first exhaust step for exhausting the treating space, after the treating step; a purge step for supplying a purge gas to the treating space after the first exhaust step; and a second exhaust step for exhausting the treating space after the purge step, wherein a pressure of the treating space at the purge step is larger than a pressure of the treating space at the treating step.

The inventive concept provides a substrate treating apparatus. The substrate treating apparatus includes a housing defining a treating space; a chuck supporting and heating a substrate at the treating space; an electrode configured to generate a plasma at a plasma space in fluid communication with the treating space; a power module configured to apply a power to the electrode; an ion blocker positioned between the plasma space and the treating space, and collecting an ion from the plasma generated at the plasma space; a shower head positioned between the ion blocker and the treating space, the shower head and the ion blocker defining a mixing space provided between the treating space and the plasma space; a gas supply unit configured to supply a gas to the plasma space or the mixing space; an exhaust unit configured to exhaust an atmosphere of the treating space; and a controller, wherein the controller controls the chuck such that the chuck heats the substrate to a process temperature, controls the gas supply unit and the exhaust unit such that a pressure of the treating space is stabilized to a preset process pressure, and controls the power module to generate the plasma at the plasma space after the pressure of the treating space is stabilized to the process pressure and after a temperature of the substrate placed on the chuck is stabilized to the process temperature.

In an embodiment, the controller controls the gas supply unit to supply the gas to the treating space and increase a pressure of the treating while a temperature of the substrate is stabilizing to the process temperature.

In an embodiment, the controller (a) controls the power module and the gas supply unit so the gas supply unit supplies an inert gas to the plasma space and for the electrode to form an electric field at the plasma space after a temperature of the substrate and a pressure of the treating space is stabilized, and (b) controls the power module and the gas supply unit so the plasma is generated by supplying a gas including a fluorine to the plasma space after the electric field is formed and a preset time is passed.

According to an embodiment of the inventive concept, a substrate may be effectively treated.

According to an embodiment of the inventive concept, a film formed on a substrate may be effectively removed.

According to an embodiment of the inventive concept, a film formed on a substrate may be etched without a particle contamination according to process by-products.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
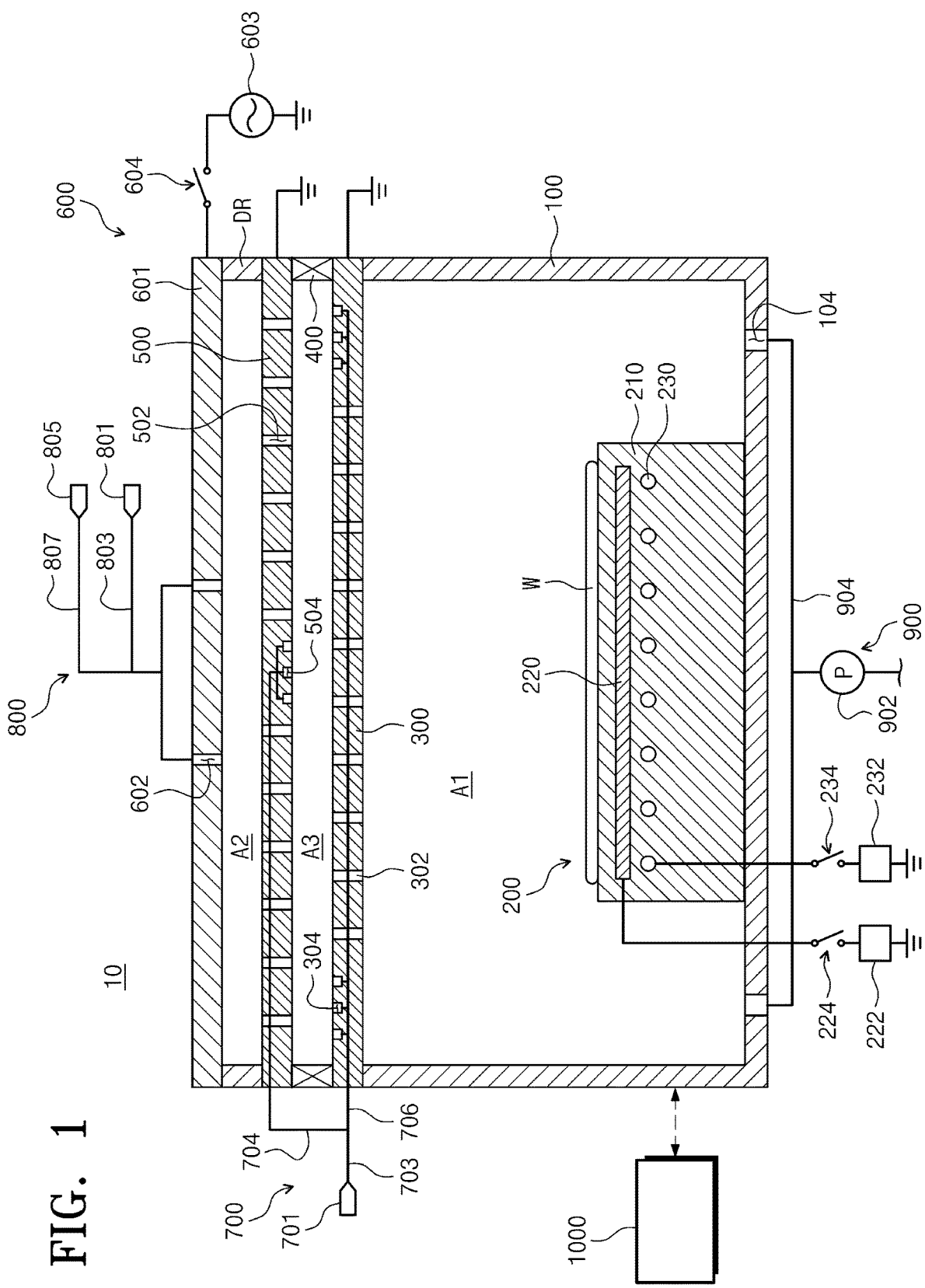
FIG. 1 illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to FIG. 1 to FIG. 10.

FIG. 1 schematically illustrates a substrate treating apparatus according to an embodiment of the inventive concept. Referring to FIG. 1, the substrate treating apparatus 10 according to an embodiment of the inventive concept may treat a substrate W. The substrate treating apparatus 10 may treat the substrate W using a plasma. The substrate treating apparatus 10 may remove a thin film formed on the substrate W using the plasma. For example, the substrate treating apparatus 10 may supply an etchant to the substrate W to remove the thin film formed on the substrate W. For example, the substrate treating apparatus 10 may remove the thin film including a silicon Si formed on the substrate W. For example, the substrate treating apparatus 10 may etch a substrate W having an Si, an $SiO_2$, an $Si_3N_4$, and a Poly Si film without a particle contamination. The substrate W may be a wafer.

The substrate treating apparatus 10 may include a housing 100, a chuck 200, a shower head 300, a heating member 400, an ion blocker 500, an insulating member DR, an electrode unit 600, gas supply units 700 and 800, an exhaust unit 900, and a controller 1000.

The housing 100 and the shower head 300 may be combined with each other to define a treating space A1 (an exemplary first space) in which the substrate W is treated. The ion blocker 500, the insulating member DR, and the top electrode 601 may be combined with each other to define a plasma space A2 (an exemplary second space) in which the plasma P is generated. In addition, the shower head 300, the heating member 400, and the ion blocker 500 may be combined with each other to define a mixing space A3 (an exemplary third space) in which a plasma devoid of ions, i.e., a neutral gas (radical) and a first process gas G1 supplied by a first gas supply unit 700 are mixed with each other. The third space A3 is provided between the first space A1 and the second space A2 and is fluidly communicated with the first space A1 and the second space A2 respectively. Components involved in defining the treating space A1, the plasma space A2, and the mixing space A3 may be collectively referred to as a chamber. In addition, the treating space A1 and the mixing space A3 may fluidly communicate with each other. In addition, the mixing space A3 and the plasma space A2 may fluidly communicate with each other. In addition, the plasma space A2 and the treating space A1 may fluidly communicate with each other through the mixing space A3.

The housing 100 may define the treating space A1. For example, the housing 100 in combination with the shower head 300 may define the treating space A1. The housing 100 may have a container shape with an open top. An inner wall of the housing 100 may be coated with a material capable of preventing the neutral gas (radical), the plasma (P), or an etchant (E) to be described later from etching the inner wall thereof. For example, the inner wall of the housing 100 may be coated with a dielectric film such as a ceramic. In addition, the housing 100 may be grounded. In addition, a door (not illustrated) may be installed in the housing 100 so that the substrate W may be brought into the treating space A1 or taken out of the treating space A1. The door may be selectively open and closed. In addition, a temperature control member (not shown) for adjusting a temperature of the housing 100 may be provided in the inner wall of the housing 100. The temperature of the housing 100 may be adjusted to about 0° C. to 200° C. by the temperature control member (not shown).

The chuck 200 may support the substrate W in the treating space A1. The chuck 200 may heat the substrate W. In addition, the chuck 200 may be an electrostatic chuck (ESC) capable of chucking the substrate W using an electrostatic force. The chuck 200 may include a support plate 210, an electrostatic electrode 220, and a heater 230.

The support plate 210 may support the substrate W. The support plate 210 may have a support surface supporting the substrate W. The support plate 210 may be provided as a dielectric. For example, the support plate 210 may be made of a ceramic material. The electrostatic electrode 220 may be provided in the support plate 210. The electrostatic electrode 220 may be provided at a position overlapping the substrate W when viewed from above. For example, a substantial portion of the electrostatic electrode 220 may overlap with the substrate W. When a power is applied to the electrostatic electrode 220, the electrostatic electrode 220 may form an electric field by an electrostatic force capable of chucking the substrate W. The resulting attractive force by the electric field may chuck the substrate W in a direction toward the support plate 210.

In addition, the substrate treating apparatus 10, for example, the chuck 200, may include first power modules 222 and 224 that apply the power to the electrostatic electrodes 220. The first power modules 222 and 224 may include an electrostatic electrode power source 222 and an electrostatic electrode switch 224. The power may be applied to the electrostatic electrode 220 according to an on/off of the electrostatic electrode switch 224. When the power is applied to the electrostatic electrode 220, the substrate W may be chucked to the chuck 200 by the electrostatic force.

The heater 230 may heat the substrate W. The heater 230 may heat the substrate W by increasing a temperature of the support plate 210. In addition, when the power is applied to the heater 230, the heater 230 may generate a heat. The heater 230 may be a heating element such as a tungsten. However, the type of the heater 230 is not limited thereto, and may be variously modified to a known heater. For example, the heater 230 may control the temperature of the support plate 210 to 0° C. to 110° C.

In addition, the substrate treating apparatus 10, for example, the chuck 200, may include second power modules 232 and 234, which apply the power to the heater 230. The second power modules 232 and 234 may include a heater power source 232 and a heater power switch 234. The power may be applied to the heater 230 according to an on/off of the heater power switch 234.

The shower head 300 may be disposed on the top of the housing 100. For example, the shower head 300 covers the top of the housing 100 to define upper limit of the treating space A1. The shower head 300 may be disposed between the ion blocker 500 to be described later and the treating space A1. The shower head 300 may be disposed between the mixing space A3 and the treating space A1, e.g., the shower head 300 may define the boundary between the mixing space A3 and the treating space A1. The shower head 300 may be grounded. In addition, a plurality of holes 302 may be formed at the shower head 300. The holes 302 may be formed to extend from a top surface to a bottom surface of the shower head 300. That is, the holes 302 may be formed through the shower head 300. The hole 302 may indirectly fluidly communicate the treating space A1 with the plasma space A2 to be described later. In addition, the hole 302 may fluidly communicate the treating space A1 with the mixing space A3 to be described later.

In addition, a gas inlet 304 may be formed at the shower head 300. The gas inlet 304 may be connected to a second gas line 706 to be described later. The gas inlet 304 may be configured to supply a first process gas G1 toward the mixing space A3. The gas inlet 304 may be configured to supply the first process gas G1 to an edge region of the mixing space A3. The gas inlet 304 may be configured such that a gas discharge direction faces the mixing space A3 (also indirectly faces the plasma space A2), but does not face the treating space A1.

The heating member 400 may be disposed above the shower head 300. The heating member 400 may be a ring heater having a ring shape when viewed from above. The heating member 400 may generate a heat to increase a temperature of the mixing space A3 so that the plasma P from which ions are removed and the first process gas G1 may be more effectively mixed.

The ion blocker 500 may separate the plasma space A2 and the mixing space A3 (further, indirectly separate the plasma space A2 and the treating space A1). The ion blocker 500 may be disposed between the top electrode 601 and the treating space A1. In addition, the ion blocker 500 may be disposed between the treating space A1 and the plasma space A2.

The ion blocker 500 may be disposed on the top of the heating member 400. The ion blocker 500 may be grounded. The ion blocker 500 may be grounded to remove (or collect) ions included in the plasma P which is generated in the plasma space A2 and flows into the mixing space A3 and further the treating space A1. The ion blocker 500 may be disposed on a flow path of the plasma P which is generated in the plasma space A2 and flows toward the treating space A1. In short, since the plasma P generated in the plasma space A2 passes through the ion blocker 500 to the mixing space A3, the plasma P arriving at the mixing space A3 may substantially contain only neutral gas (radical) without ions.

In addition, the ion blocker 500 may be grounded and function as an electrode opposite to the top electrode 601 to be described later. A plurality of through holes 502 may be formed at the ion blocker 500. The through holes 502 may be formed through the ion blocker 500. The through holes 502 may fluidly communicate the plasma space A2 with the mixing space A3. The through holes 502 may fluidly communicate the plasma space A2 with the treating space A1.

In addition, a gas supply port 504 may be formed at the ion blocker 500. The gas supply port 504 may be connected to a first gas line 704 to be described later. The gas supply port 504 may be configured to supply a process gas to the mixing space A3. The gas supply port 504 may be configured such that a gas discharge direction faces the mixing space A3 (also indirectly faces the treating space A1), but does not face the plasma space A2.

The electrode unit 600 may generate the plasma P in the plasma space A2. The electrode unit 600 may include a top electrode 601 and top power modules 602 and 604.

The top electrode 601 may have a plate shape. The top electrode 601 may generate the plasma. The top power modules 603 and 604 may apply a power to the top electrode 601. The top power modules 603 and 604 may include a top power source 603 which is an RF source and a top power switch 604. The power may be applied to the top electrode 601 according to an on/off of the top power switch 604. When the power is applied to the top electrode 601, an electric field is formed between the ion blocker 500 functioning as an opposite electrode and the top electrode 601, and thus a second process gas G2 and/or an inert gas IG to be described later may be excited in the plasma space A2. Accordingly, the plasma P may be generated. In addition, a gas injection port 602 may be formed at the top electrode 601. The second gas supply unit 800, which will be described later, may supply the second process gas G2 or the inert gas IG to the plasma space A2 through the gas injection port 602. In addition, the insulating member DR provided as an insulating material may be disposed between the top electrode 601 and the ion blocker 500. The insulating member DR may have a ring shape when viewed from above.

The gas supply units 700 and 800 may supply a gas. The gas supply units 700 and 800 may include a first gas supply unit 700 and a second gas supply unit 800.

The first gas supply unit 700 may supply the first process gas G1 to the mixing space A3. The first gas supply unit 700 may supply the first process gas to the mixing space A3 when the plasma P from which ions are removed by the ion blocker 500, that is, the neutral gas (radical), is introduced into the mixing space A3. The first gas supply unit 700 may supply the first process gas G1 including a nitrogen and a hydrogen. The first gas supply unit 700 may include a first gas supply source 701, a main gas line 703, a first gas line 704, and a second gas line 706. The first gas supply source 701 may store and/or supply the first process gas G1. An end of the main gas line 703 may be connected to the first gas supply source 701, and another end of the main gas line 703 may branch to the first gas line 704 and the second gas line 706. The first gas line 704 may be connected to the gas supply port 504 of the ion blocker 500 described above. In addition, the second gas line 706 may be connected to the gas inlet 304 of the shower head 300 described above.

The first process gas G1 supplied by the first gas supply unit 700 may be at least one selected from a group consisting of an He, an Ar, a Xe, an $NH_3$, an $H_2$, an $N_2$, an O, an $NF_3$, and an $F_2$. For example, the first process gas G1 may be a gas including an $NH_3$.

The second gas supply unit 800 may supply the second process gas G2 to the plasma space A2. In addition, the second gas supply unit 800 may supply the inert gas IG to the plasma space A2. The second gas supply unit 800 may inject the second process gas G2 or the inert gas IG into the plasma space A2 to supply the second process gas G2 or the inert gas IG to the mixing space A3 and the treating space A1. The second gas supply unit 800 may include a 2-1 gas supply source 801, a first gas channel 803, a 2-2 gas supply source 805, and a second gas channel 807.

The 2-1 gas supply source 801 may store and/or supply the second process gas G2. The first gas channel 803 may be connected to the 2-1 gas supply source 801 to supply the second process gas G2 supplied from the 2-1 gas supply source 801 to the plasma space A2. The 2-1 gas supply source 801 may supply the second process gas G2 including a fluorine or a hydrogen to the plasma space A2. For example, the second process gas G2 may be a gas including at least one of an $NF_3$, an $H_2$ or combinations thereof. For example, the second process gas G2 may be a gas including an $NF_3$.

The 2-2 gas supply source 805 may store and/or supply the inert gas IG. The second gas channel 807 may be connected to the 2-2 gas supply source 805 to supply the inert gas IG supplied from the 2-2 gas supply source 805 to the plasma space A2. The 2-2 gas supply source 805 may be a gas including at least one of an He, an Ar, an Xe, an $N_2$ or combinations thereof in the plasma space A2. For example, the inert gas IG may be a gas containing an He.

The exhaust unit 900 may discharge a gas suppled to the treating space A1, process by-products, and the like. The exhaust unit 900 may adjust a pressure of the treating space A1. The exhaust unit 900 may indirectly adjust a pressure of the mixing space A3 and the plasma space A2 by adjusting the pressure of the treating space A1. The exhaust unit 900 may exhaust an atmosphere of the treating space A2 to adjust the pressure of the treating space A1, and exhaust a gas supplied to the treating space A1, by-products generated during a treating of the substrate W, and the like to an outside of the substrate treating apparatus 10. The exhaust unit 900 may include a decompression member 902 and decompression line 904. The decompression member 902 may be a pump. However, the inventive concept is not limited thereto, and may be variously modified into a known device that provides a decompression.

The controller 1000 may control the substrate treating apparatus 10, specifically, components of the substrate treating apparatus 10. For example, the controller 1000 may control the gas supply units 700 and 800, the first power modules 222 and 224, the second power modules 232 and 234, the decompression member 902, and the top power modules 602 and 604.

The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Hereinafter, a substrate treating method according to an embodiment of the inventive concept will be described. The substrate treating method described below may be performed by the substrate treating apparatus 10 described above. In addition, in order to perform the substrate treating method described below, the controller 1000 may control components of the substrate treating apparatus 10.

Figure 2:
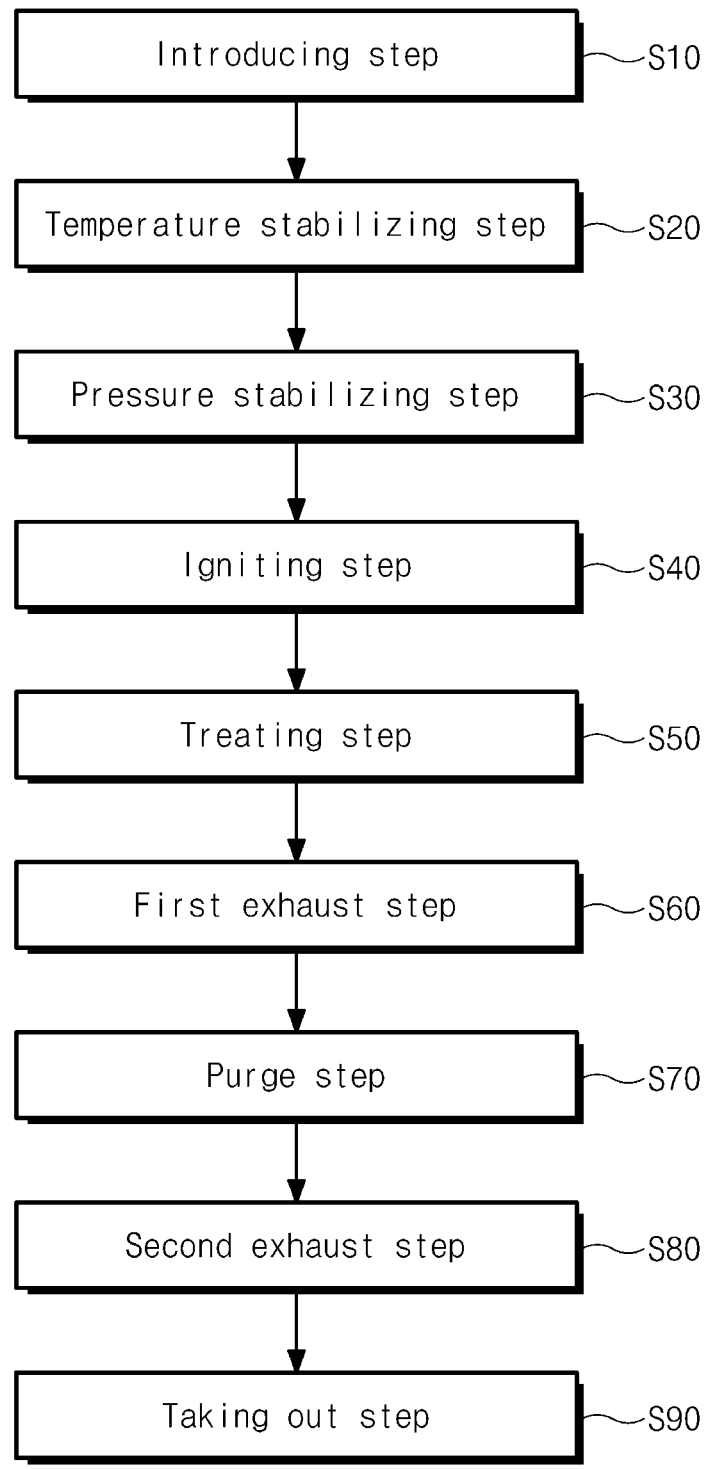
FIG. 2 is a flowchart illustrating a substrate treating method according to an embodiment of the inventive concept.
Figure 3:
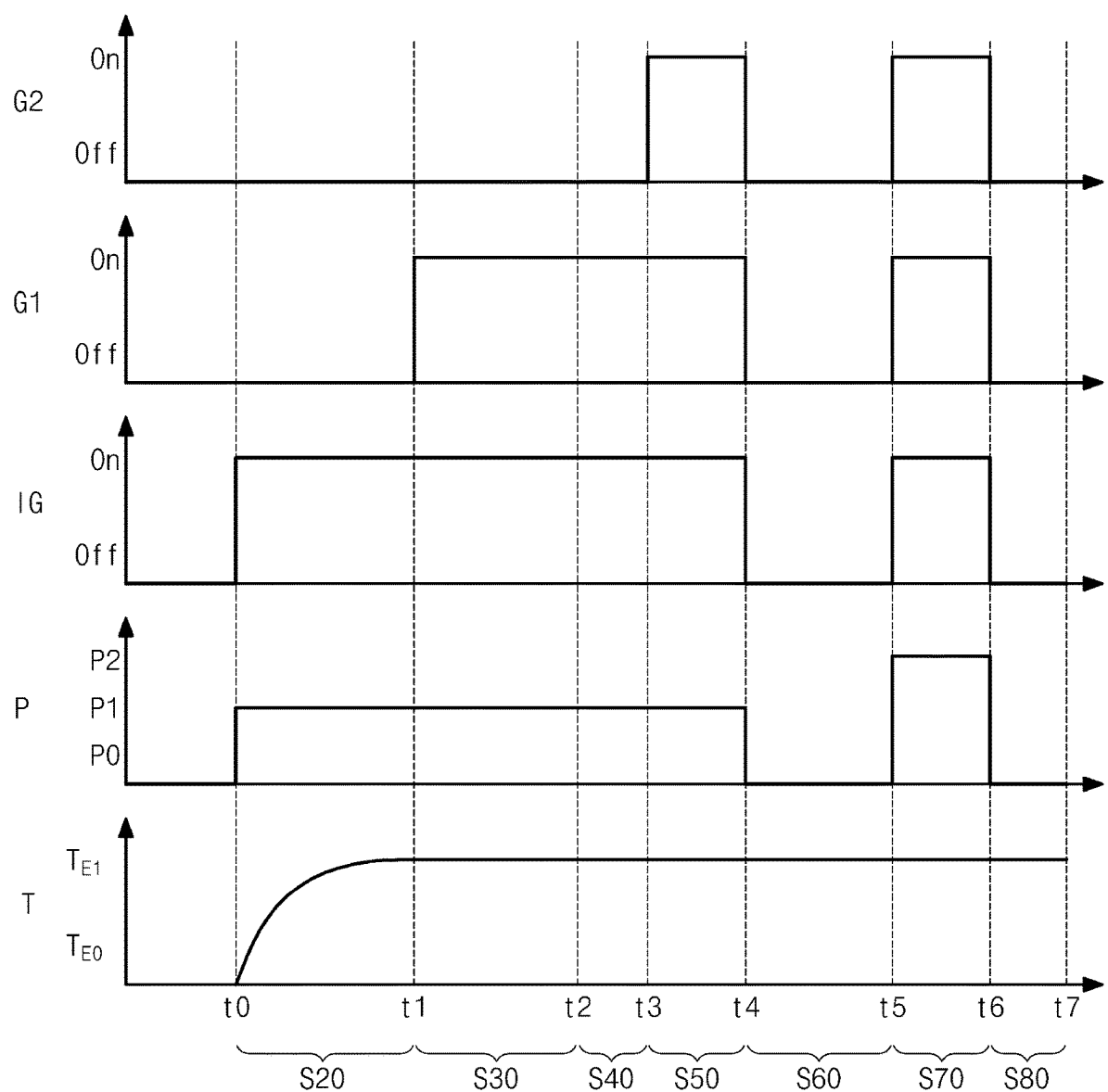
FIG. 3 is a graph showing changes in a temperature of a substrate according to each step, changes in a pressure of a treating space according to each step, whether an inert gas is supplied according to each step, whether a first gas is supplied according to each step, and whether a second gas is supplied according to each step, during the substrate treating method of FIG. 2.

FIG. 2 is a flowchart showing a substrate treating method according to an embodiment of the inventive concept, and FIG. 3 is a graph showing changes in a temperature of a substrate according to each step, changes in a pressure of a treating space according to each step, whether an inert gas is supplied according to each step, whether a first gas is supplied according to each step, and whether a second gas is supplied according to each step, while the substrate treating method of FIG. 2 is being performed. In FIG. 3, T refers to the temperature of the substrate W, P refers to the pressure of the treating space A1, IG may refer to the inert gas supplied to the treating space A1 from the plasma space A2, G1 may refer to the first process gas supplied from the first gas supply unit 700, and G2 may refer to the second process gas supplied by the second gas supply unit 800.

Referring to FIG. 2 and FIG. 3, the substrate treating method according to an embodiment of the inventive concept may include an introducing step S10, a temperature stabilizing step S20, a pressure stabilizing step S30, an igniting step S40, a treating step S50, a first exhaust step S60, a purge step S70, a second exhaust step S80, and a taking out step S90.

During the temperature stabilizing step S20, the pressure stabilizing step S30, the igniting step S40, the treating step S50, and the purge step S70, the pressure of the treating space A1 may be adjusted to about 1 to 10 Torr.

In addition, the temperature of the support plate 210 may be adjusted to 0 to 110° C. during the introducing step S10, the temperature stabilizing step S20, the pressure stabilizing step S30, the igniting step S40, the treating step S50, the first exhaust step S60, the purge step S70, the second exhaust step S80, and the taking out step S90.

In addition, temperatures of components of the housing 100 and other components of the substrate treating device 10 may be adjusted to 0-200° C. during the introducing step S10, the temperature stabilizing step S20, the pressure stabilizing step S30, the igniting step S40, the treating step S50, the first exhaust step S60, the purge step S70, the second exhaust step S80, and the taking out step S90.

The introducing step S10 (~t0) may be a step of introducing the substrate W into the treating space A1. In the introducing step S10, a door installed in the housing 100 and functioning as an inlet/outlet is opened, and a transfer robot (not shown) may introduce the substrate W into the treating space A1 through the opened door. The transfer robot may load the substrate W on the support plate 210 of the chuck 200. The introducing step S10 may be completed before to.

Figure 4:
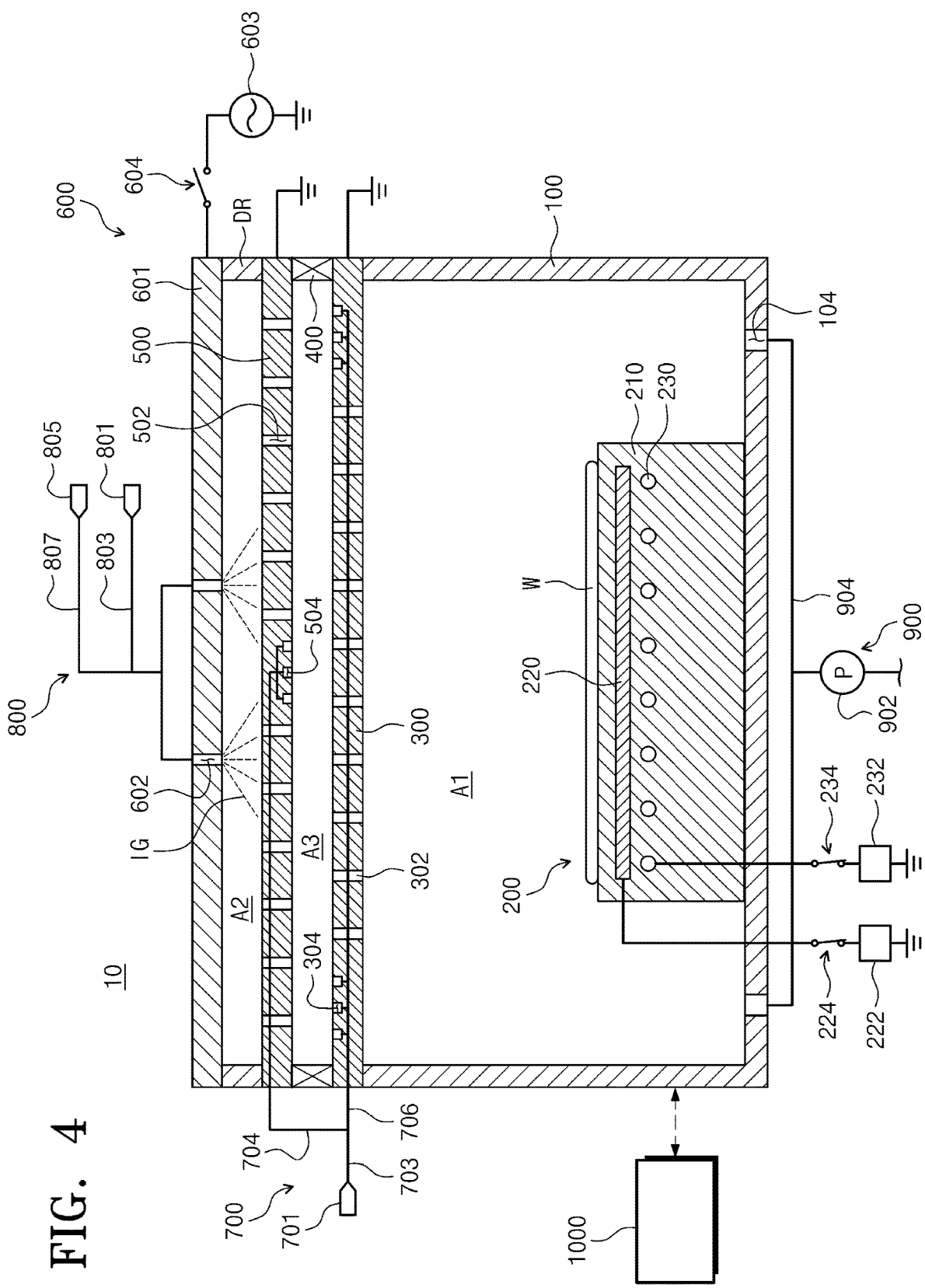
FIG. 4 illustrates the substrate treating apparatus performing a temperature stabilizing step of FIG. 2.

In the temperature stabilizing step S20 (t0 to t1) the substrate W may be heated (see FIG. 4). In the temperature stabilizing step S20, the temperature of the substrate W may be heated to a preset process temperature, and the temperature of the substrate W may be stabilized so that the temperature of the substrate W is constantly maintained at the process temperature. For example, in the temperature stabilizing step S20, the temperature of the substrate W may be changed from an initial temperature TE0 to the process temperature TE1. The process temperature TE1 may be higher than the initial temperature TE0. The process temperature TE1 may be 100° C. or greater.

In the temperature stabilizing step S20, the electrostatic electrode switch 224 is turned on so that the electrostatic electrode 220 may chuck the substrate W. In addition, the heater power switch 234 is turned on so that the heater 230 heats the support plate 210 and the heated support plate 210 heats the substrate W. In this case, the second gas supply unit 800 may supply the inert gas IG to the plasma space A2. The inert gas IG supplied by the second gas supply unit 800 may be introduced into the treating space A1 through the plasma space A2 and the mixing space A3. Accordingly, the pressure of the treating space A1 may be increased from the initial pressure P0 to a first pressure P1, which is greater than the initial pressure P0. In addition, the controller 1000 may control the second gas supply unit 800 and the exhaust unit 900 so that the pressure of the treating space A1 is maintained as the first pressure P1. For example, the controller 1000 may control the second gas supply unit 800 and the exhaust unit 900 so that a supply flow rate of the inert gas IG per unit time supplied by the second gas supply unit 800 is the same as an exhaust flow rate of the inert gas IG per unit time exhausted by the exhaust unit 900.

In the temperature stabilizing step S20, the heater 230 heats the substrate W to stabilize the temperature of the substrate W to the process temperature, and simultaneously the pressure of the treating space A1 is boosted to the first pressure P1. This is because the pressure in the treating space A1 affects a temperature change and a temperature stabilization. Accordingly, in the temperature stabilizing step S20 of this invention, the second gas supply unit 800 and/or the exhaust unit 900 boosts and maintains the pressure of the treating space A1 to the first pressure P1, which is the pressure for the treating step S50. Accordingly, the temperature of the substrate W may be stabilized to the process temperature under the same or similar environment as the treating step S50. In other words, although an etch rate with respect to a film on the substrate W may vary according to the temperature of the substrate W, this invention may improve a reliability of the etching rate by raising the pressure of the treating space A1 to the first pressure P1 (process pressure) in the temperature stabilizing step S20.

Figure 5:
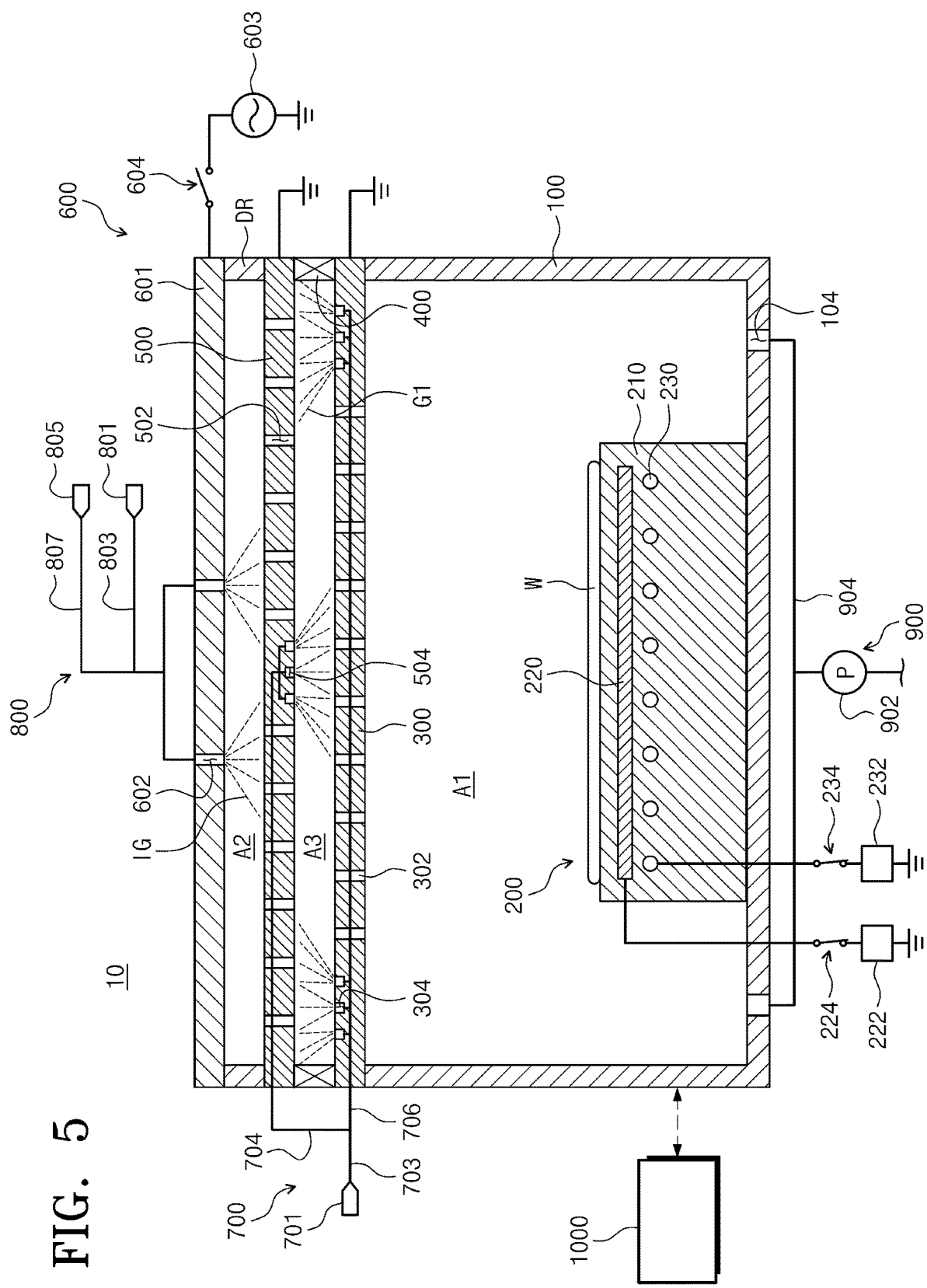
FIG. 5 illustrates the substrate treating apparatus performing a pressure stabilizing step of FIG. 2.

In the pressure stabilizing step S30 (t1 to t2), the pressure of the plasma space A2 and the treating space A1 may be stabilized to the process pressure (see FIG. 5). For example, the pressure of the treating space A1 may be constantly maintained as the first pressure P1. In addition, the process pressure of the plasma space A2 and the treating space A1 may be the same. However, since the plasma space A2 and the treating space A1 are separated from each other by the shower head 300 and the ion blocker 500, the process pressure of the plasma space A2 and the process pressure of the treating space A1 may be somewhat different.

In the pressure stabilizing step S30, the first gas supply unit 700 may supply the first process gas G1 to the mixing space A3. In addition, in the pressure stabilizing step S30, the second gas supply unit 800 may supply the inert gas IG to the plasma space A2. More kinds of gas may be supplied to the pressure stabilizing step S30 than in the temperature stabilizing step S20.

In order to maintain the pressure of the treating space A1 constantly in the pressure stabilizing step S30 at the first pressure P1, a supply flow rate per unit time of the inert gas IG continuously supplied from the temperature stabilizing step S20 may be reduced, or a gas exhaust rate per unit time of the exhaust unit 900 may be further increased to maintain the pressure of the treating space A1 at the first pressure P1. The pressure of the treating space A1, the plasma space A2, and the mixing space A3 during the pressure stabilizing step S30 may be equal to or similar to the pressure of the treating space A1, the plasma space A2, and the mixing space A3 during the treating step S50. In the pressure stabilizing step S30, the pressure of the treating space A1, the plasma space A2, and the mixing space A3 are constantly maintained (i.e., stabilized) at the process pressure, thereby improving the reliability of the etching rate.

Figure 6:
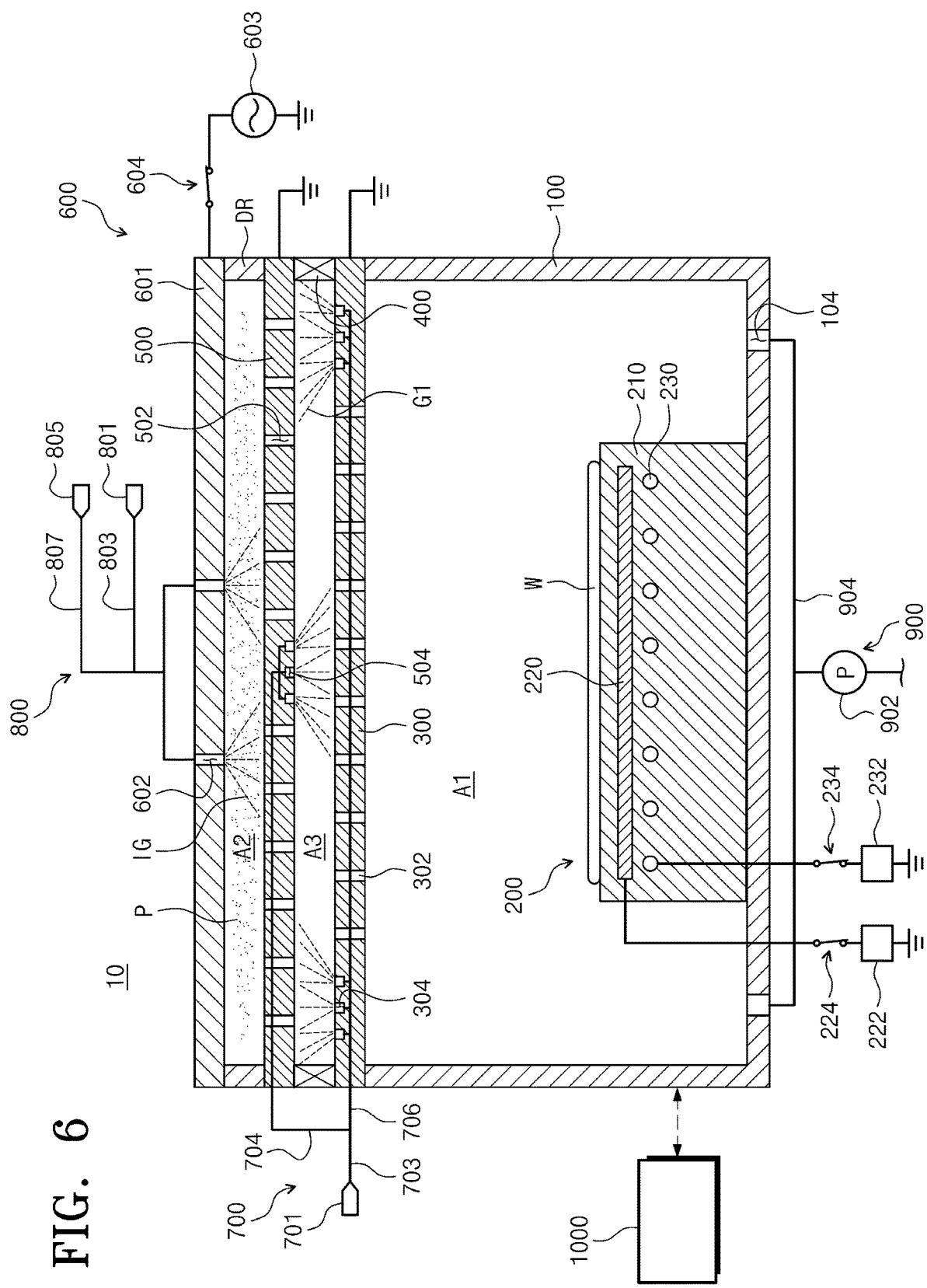
FIG. 6 illustrates the substrate treating apparatus performing an igniting step of FIG. 2.

The igniting step S40 (t2 to t3) may be performed between the pressure stabilizing step S30 and the treating step S50 (see FIG. 6). In the igniting step S40, the first gas supply unit 700 may supply the first process gas G1 to the mixing space A3, and the second gas supply unit 800 may supply the inert gas IG to the plasma space A2. In the igniting step S40, the top electrode 601 may form an electric field in the plasma space A2 to excite portions of the inert gas IG, thereby forming a plasma atmosphere in the plasma space A2. That is, in the igniting step S40 of the inventive concept, the plasma atmosphere is formed in the plasma space A2 without supplying the second process gas G2 to the plasma space A2. The plasma atmosphere formed in the plasma space A2 by the inert gas IG in the igniting step S40 may assist excitation the second process gas G2 in the subsequent treating step S50 for etching the substrate W.

Figure 7:
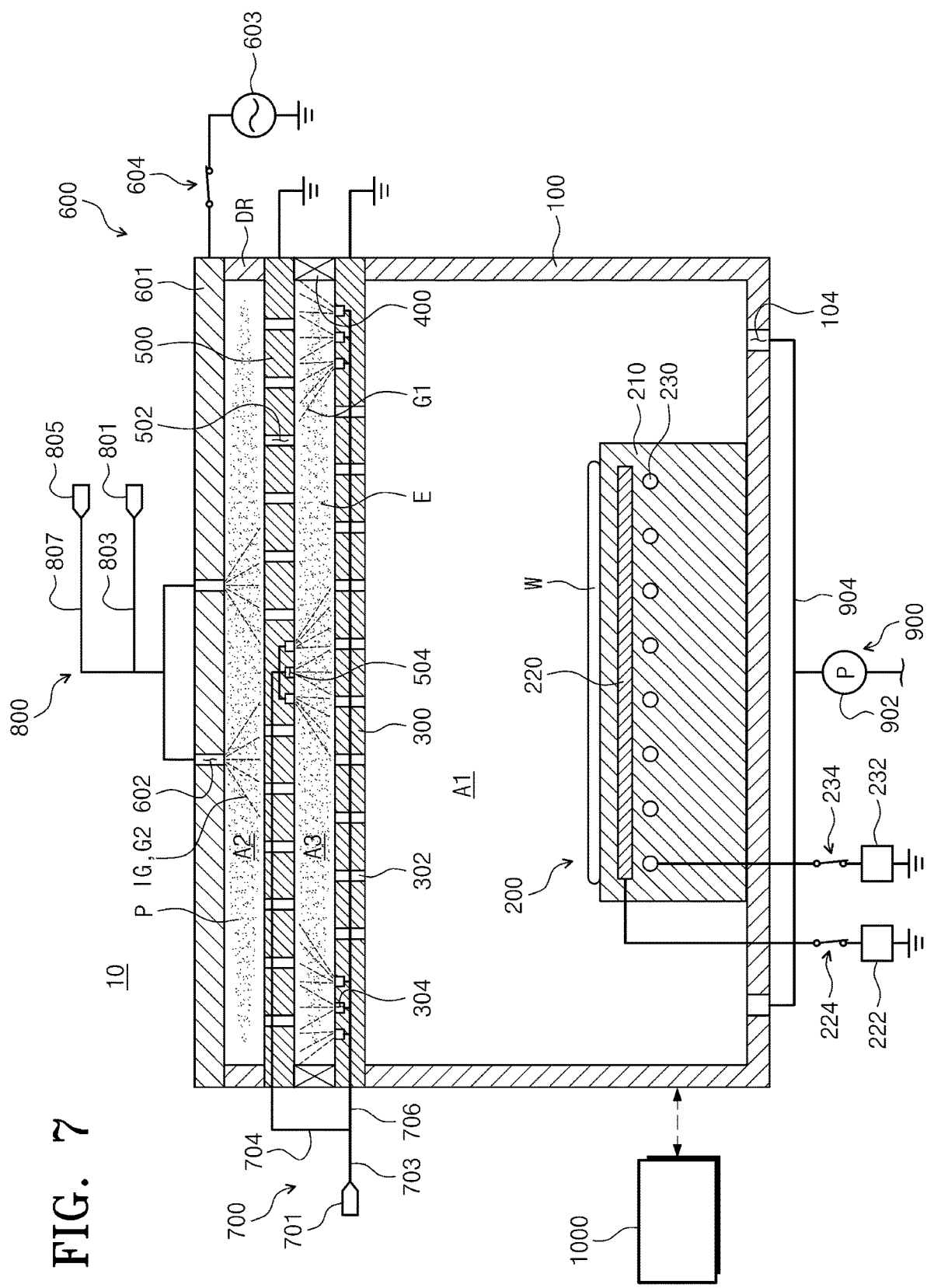
FIG. 7 illustrates the substrate treating apparatus performing a treating step of FIG. 2.

In the treating step S50 (t3 to t4), the etching on the substrate W may be performed (see FIG. 7). In the treating step S50, the second gas supply unit 800 may supply the second process gas G2 to the plasma space A2. Selectively, the inert gas IG may be further supplied to the plasma space A2 according to a type and amount of an etchant to be generated. In addition, in the treating step S50, the first gas supply unit 700 may supply the first process gas G1 to the mixing space A3. The first process gas G1 may be a gas containing a hydrogen such as $NH_3$-, which is a reaction gas. In addition, the inert gas IG may be a gas including at least one selected from an He, an Ar, an Xe, an $N_2$— or combinations thereof. In addition, the second process gas G2 may be a gas including an $H_2$ capable of generating hydrogen radicals H* or a gas including an $NF_3$— capable of generating fluorine radicals F*. Hereinafter, an example where the inert gas IG is a gas including an He, the first process gas G1 is a gas including $NH_3$, and the second process gas G2 is a gas including an $NF_3$. In addition, it will be described as an example that the film formed on the substrate W to be removed is a film containing an $SiO_2$.

In the treating step S50 of the inventive concept, an etching process mechanism is as follows.

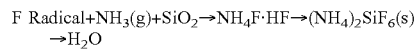

A solid by-product $(NH_4)_2SiF_6$ may be decomposed and vaporized at 100° C.

In more detail, the second process gas G2 including an $NF_3$ supplied to the plasma space A2 may be excited to a plasma P state. The ions of the plasma P generated in the plasma space A2 may be trapped in the ion blocker 500 disposed between the mixing space A3 and the plasma space A2 while being introduced into the mixing space A3. Accordingly, only fluorine radicals F* may be substantially introduced into the mixing space A3.

In this case, the fluorine radical F* introduced into the mixing space A3 and the first process gas G1, which is a gas including an $NH_3$— may react with each other to generate the etchant E, NH4F·HF, which are reactants. In addition, the etchant E may be applied to the substrate W. The etchant E can react with a film formed on the substrate W, for example, a film including an $SiO_2$, to produce an $(NH_4)_2SiF_6$, which is a solid by-product. In this case, since the temperature of the substrate W is heated to a temperature higher than 100° C., the solid by-product $(NH_4)_2SiF_6$ may be removed from the substrate W. A vaporized $(NH_4)_2SiF_6$ may be discharged from the substrate treating apparatus 10 by the exhaust unit 900.

Figure 8:
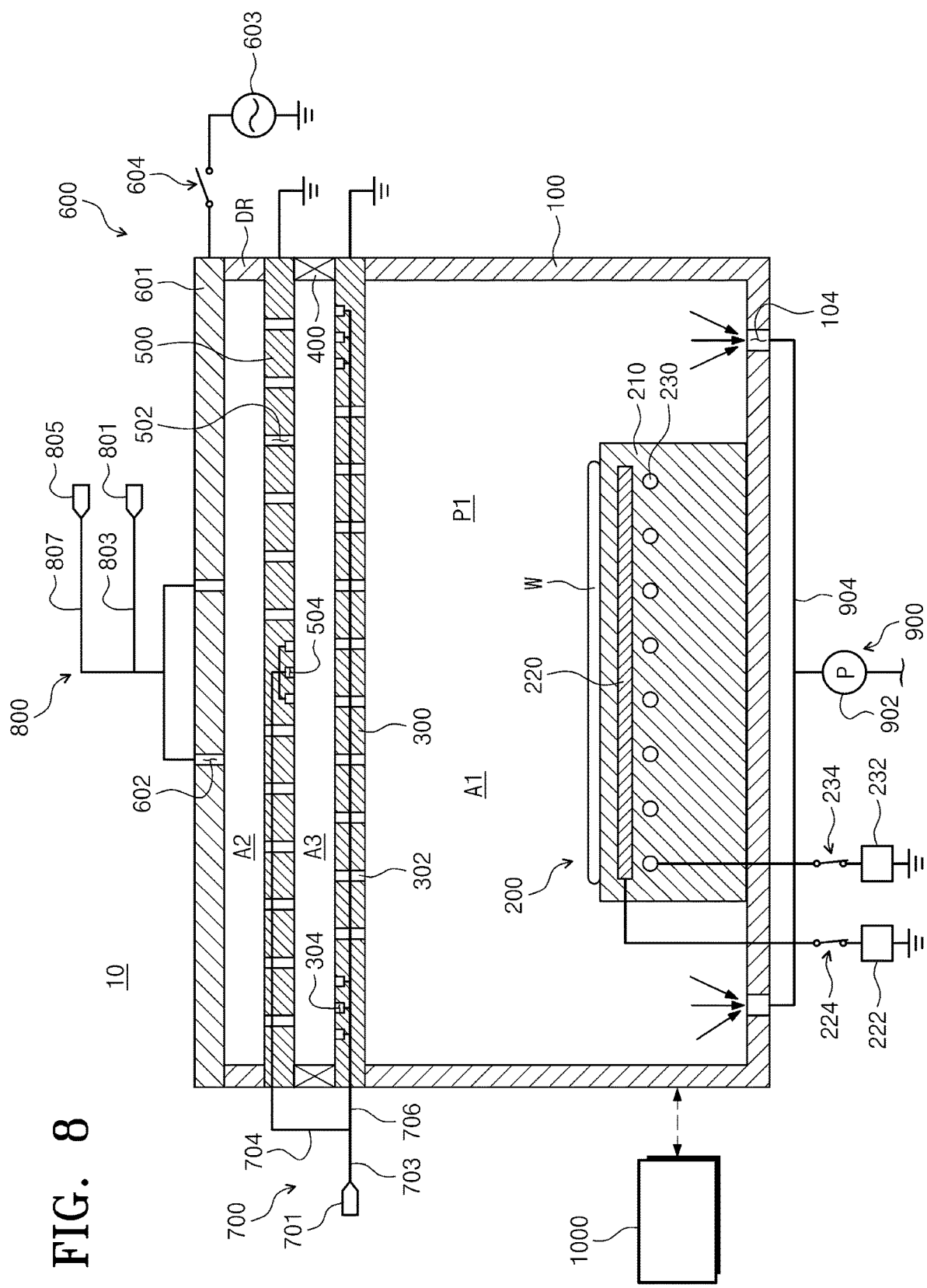
FIG. 8 illustrates the substrate treating apparatus performing a first exhaust step of FIG. 2.
Figure 9:
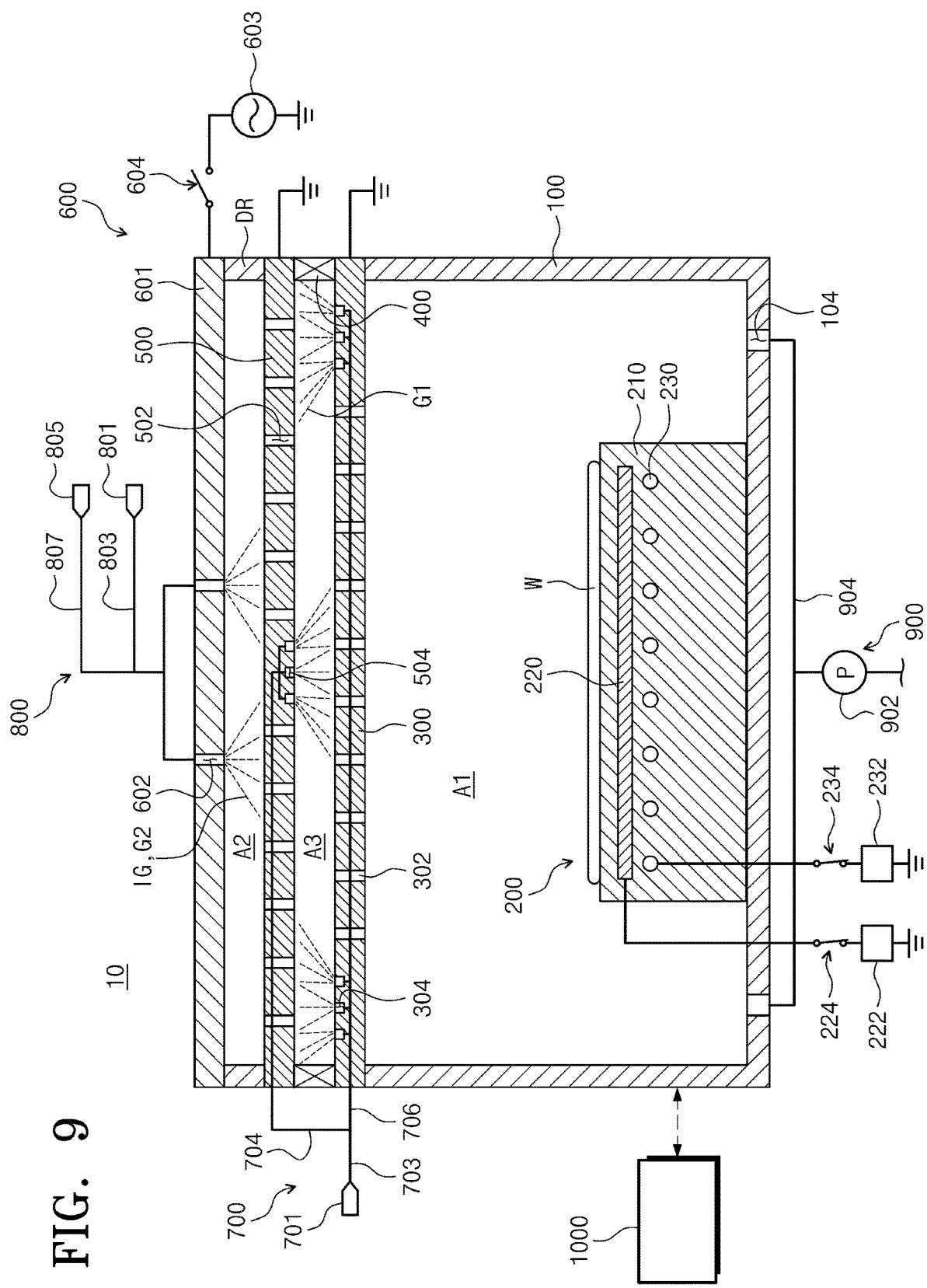
FIG. 9 illustrates the substrate treating apparatus performing a purge step of FIG. 2.

In the first exhaust step S60 (t4 to t5), process by-products generated in the treating of the substrate W and gases supplied to the treating space A1 may be exhausted to an outside of the substrate treating apparatus 10 (see FIG. 8). In the first exhaust step S60, a supply of the first process gas G1, the second process gas G2, and the inert gas IG may be stopped, and the atmosphere of the treating space A1 maintained at the first pressure P1 may be exhausted. In this case, the pressure of the treating space A1 may be controlled to a pressure of 100 m Torr or less.

In the purge step S70 (t5 to t6), the pressure of the treating space A1 may be increased. In the purge step S70, the purge gas may be supplied to the treating space A1, the mixing space A3, and the plasma space A2 (see FIG. 9). In the purge step S70, the pressure of the treating space A1 may be increased to a second pressure P2, which is a pressure higher than the first pressure P1. The purge gas may include the first process gas G1 supplied from the first gas supply unit 700, the second process gas G2 supplied from the second gas supply unit 800, and an inert gas IG, but is not limited thereto. For example, the purge gas may include only the inert gas. Specifically, in the purge step S70, the first gas supply unit 700 may further include an inert gas supply unit (not shown) supplying the inert gas to the mixing space A3 through the main gas line 703, and the second gas supply unit 800 may also supply the inert gas to the plasma space A2. In the purge step S70, the pressure of the treating space A2 may be increased to the second pressure P2, which is a relatively high pressure. For example, in the purge step S70, the pressure of the treating space A1 may be greater than the pressure of the treating space A1 in the treating step S50. In the purge step S70, the treating space A1 may be pressurized to separate residual solid by-products and process by-products that may be attached to an inner wall of the housing 100 and the substrate W from the housing 100 and/or the substrate W.

Figure 10:
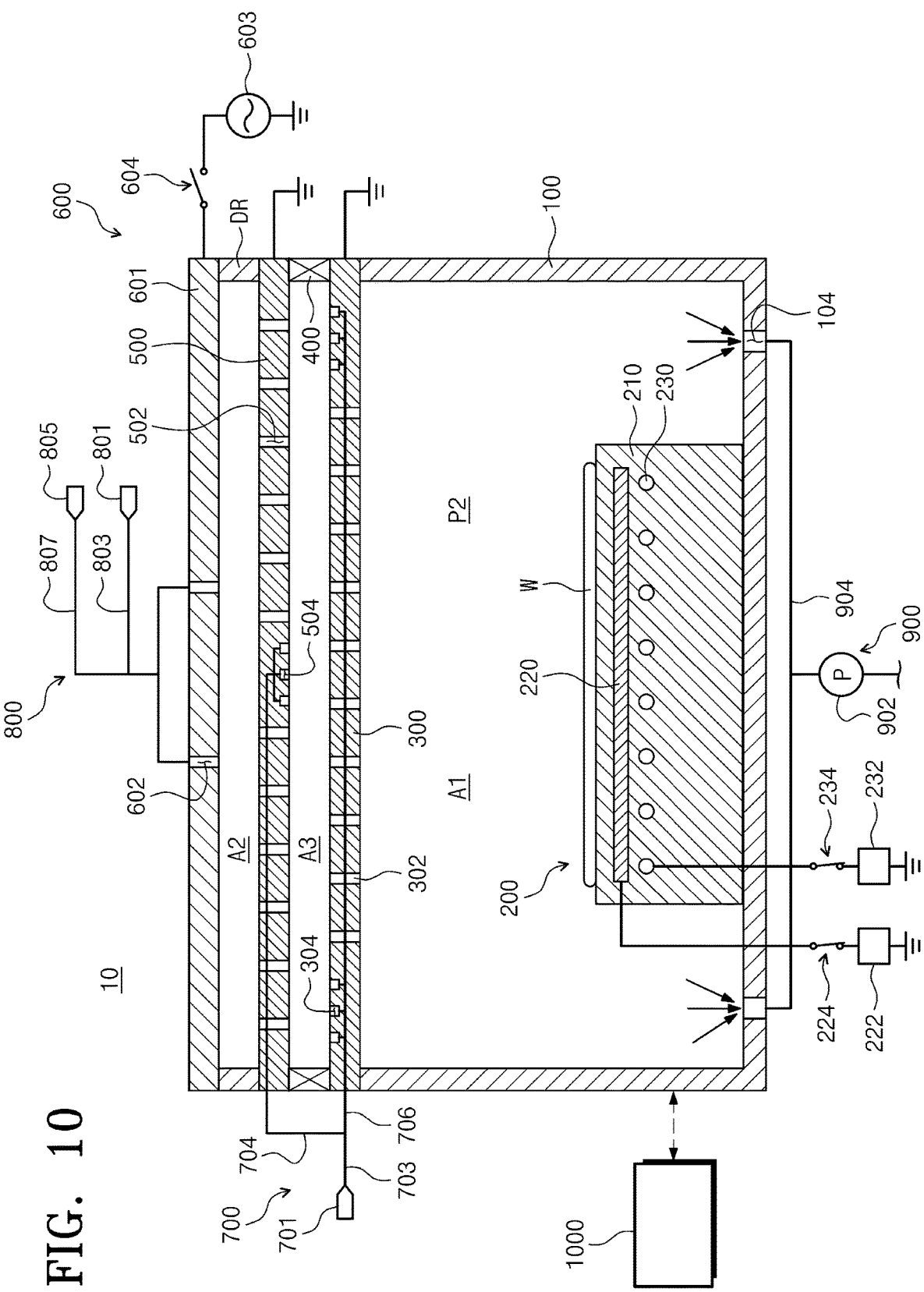
FIG. 10 illustrates the substrate treating apparatus performing a second exhaust step of FIG. 2.

In the second exhaust step S80 (t6 to t7), the residual solid by-products and process by-products separated in the purge step S70 may be exhausted to the outside of the substrate treating apparatus 10 (see FIG. 10). In the second exhaust step S80, a supply of the first process gas G1, the second process gas G2, and the inert gas IG may be stopped, and the atmosphere of the treating space A1 maintained at the second pressure P2 may be exhausted. In this case, the pressure of the treating space A1 may be controlled to a pressure of 100 m Torr or less.

The taking-out step S90 (t7~) may be a step of taking out the substrate W from the treating space A1. In the taking-out step S90, the door formed in the housing 100 and functioning as an inlet/outlet is opened, and a transfer robot (not shown) may take the substrate W out of the treating space A1 through the opened door. The transfer robot may unload the substrate W on the support plate 210 of the chuck 200. The introducing step S10 may be performed after t7.

In the above-described example, the top electrode 601 generates the plasma P in the plasma space A2, but this invention is not limited to it. For example, a bottom electrode (not shown) may be provided inside the chuck 200, and a bottom power source for applying an RF power may be connected to the bottom electrode. That is, the plasma P may be generated in the treating space A1, the first process gas G1 may be supplied to the treating space A1, and the first process gas G1 reacts with the plasma P including a fluorine or hydrogen radicals to generate the etchant E.

In the above-described example, the second process gas G2 is an $NF_3$, but the inventive concept is not limited thereto. For example, the second process gas G2 may be modified into various gases including fluorine.

In the above-described example, the second process gas G2 is a gas including a fluorine, but the inventive concept is not limited thereto. For example, the second process gas G2 may be a gas containing a hydrogen. For example, the second process gas G2 may be a gas containing a $H_2$. The second process gas G2 may be modified into various gases capable of generating hydrogen radicals H*.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a housing defining a treating space;
a chuck supporting and heating a substrate at the treating space;
an electrode configured to generate a plasma at a plasma space in fluid communication with the treating space;
a power module configured to apply a power to the electrode;
an ion blocker positioned between the plasma space and the treating space, and collecting an ion from the plasma generated at the plasma space;
a shower head positioned between the ion blocker and the treating space, the shower head and the ion blocker defining a mixing space provided between the treating space and the plasma space;
a first gas supply unit configured to supply a first process gas directly to the mixing space;
a second gas supply unit configured to supply a second process gas directly to the plasma space;
an exhaust unit configured to exhaust an atmosphere of the treating space; and
a controller configured to:
control the chuck in a temperature stabilizing step to heat the substrate to a process temperature, control the second gas supply unit to supply an inert gas to the plasma space such that pressure of the treating space is increased to a first pressure, which is a preset process pressure, and control the exhaust unit to maintain the pressure of the treating space at the first pressure;
control the first gas supply unit in a pressure stabilizing step after the temperature stabilizing step to supply the first process gas to the mixing space, control the second gas supply unit to supply the inert gas to the plasma space, and control the exhaust unit to maintain the treating space at the first pressure;
control the first gas supply unit in an igniting step after the pressure stabilizing step to supply the first process gas to the mixing space, control the second gas supply unit to supply the inert gas to the plasma space, and control the power module to apply power to the electrode to form an electric field in the plasma space, thereby exciting portions of the inert gas and forming a plasma atmosphere in the plasma space;
control the second gas supply unit in a treating step after the igniting step to supply the second process gas to the plasma space, control the first gas supply unit to supply the first process gas to the mixing space, wherein the first process gas comprises hydrogen, and the second process gas comprises at least one selected from $H_2$ and $NF_3$;

control the first gas supply unit and the second gas supply unit in a first exhaust step after the treating step to stop supplying the first process gas, the second process gas, and the inert gas, and control the exhaust unit to exhaust the atmosphere of the treating space while reducing the pressure of the treating space to 100 mTorr or less;

control at least one of the first gas supply unit and the second gas supply unit in a purge step after the first exhaust step to supply a purge gas including at least one of the first process gas, the second process gas, and the inert gas to the treating space, the mixing space, and the plasma space, thereby increasing the pressure of the treating space to a second pressure higher than the first pressure; and control the first gas supply unit and the second gas supply unit in a second exhaust step after the purge step to stop supplying the purge gas, and control the exhaust unit to exhaust the atmosphere of the treating space while reducing the pressure of the treating space to 100 mTorr or less.

2. The substrate treating apparatus of claim 1, wherein, in a plan view, the electrode overlaps with the ion blocker.

3. The substrate treating apparatus of claim 1, wherein, in a plan view, the electrode overlaps with the shower head.

4. The substrate treating apparatus of claim 1, wherein the electrode, the ion blocker, and the shower head are sequentially disposed above the chuck in a stacking direction.

5. The substrate treating apparatus of claim 1, wherein the second gas supply unit supplies the second process gas to the housing through channels provided in the electrode.

6. The substrate treating apparatus of claim 1, wherein the electrode is disposed above an upper surface of the ion blocker to enclose an upper surface of the housing.

* * * * *